United States Patent [19]

Erdos

[11] Patent Number: 5,478,517
[45] Date of Patent: Dec. 26, 1995

[54] METHOD FOR MOLDING IC CHIPS

[75] Inventor: Geroge Erdos, Toronto, Canada

[73] Assignee: Gennum Corporation, Burlington, Canada

[21] Appl. No.: 202,621

[22] Filed: Feb. 28, 1994

[51] Int. Cl.⁶ .................. B29C 45/14; B29C 45/40
[52] U.S. Cl. ............... 264/161; 264/272.15; 264/272.17; 264/272.18; 264/275; 264/276; 264/334; 425/126.1; 425/289; 425/444
[58] Field of Search ................. 264/161, 328.9, 264/334, 272.11, 272.15, 272.17, 272.18, 275, 276, 277; 425/122, 121, 806, 444, 553, 289, 126.1

[56] References Cited

U.S. PATENT DOCUMENTS

| | | | |
|---|---|---|---|
| 2,946,102 | 7/1960 | Mills | 425/806 R |
| 3,317,961 | 5/1967 | Drevalas et al. | 425/806 R |
| 3,754,070 | 8/1973 | Dunn et al. | 264/272.17 |
| 3,915,780 | 1/1975 | Broussard, Jr. et al. | 264/272.17 |
| 4,148,856 | 4/1979 | Gress et al. | 269/272.18 |
| 4,337,574 | 7/1982 | Hughes et al. | 264/272.11 |
| 4,711,688 | 12/1987 | Pienimaa | 264/272.15 |
| 4,721,453 | 1/1988 | Belanger et al. | 425/122 |
| 4,785,527 | 11/1988 | Bernard et al. | 264/272.15 |
| 4,812,421 | 3/1989 | Jung et al. | 264/272.11 |
| 4,857,483 | 8/1989 | Steffen et al. | 264/272.11 |
| 4,913,930 | 4/1990 | Getson | 264/272.17 |
| 5,110,515 | 5/1992 | Nakamura et al. | 264/272.13 |

FOREIGN PATENT DOCUMENTS

| | | | |
|---|---|---|---|
| 62-13094 | 1/1987 | Japan | 264/272.17 |
| 3-96241 | 4/1991 | Japan | 264/272.17 |
| 5-8245 | 1/1993 | Japan | 264/272.15 |

Primary Examiner—Jay H. Woo
Assistant Examiner—Duane S. Smith
Attorney, Agent, or Firm—Bereskin & Parr

[57] ABSTRACT

To encapsulate IC chips or other parts located in openings in a tape carrier, upper and lower mold halves are closed forming a cavity about each chip. The lower mold half has a lower mold part containing a lower cavity half, and a front wall extending down to a runner groove. A slide normally covers the runner groove and contains runner channels leading to a small side gate in each cavity, without any plastic contacting the tape. After molding the upper mold half is raised and ejector pins push the molded parts with it, away from the lower mold half, performing auto degating. The molded parts are then ejected from the upper mold half, the slide is retracted and the plastic in the runner system is ejected. This allows reel to reel encapsulation of chips or other parts on a tape.

12 Claims, 4 Drawing Sheets

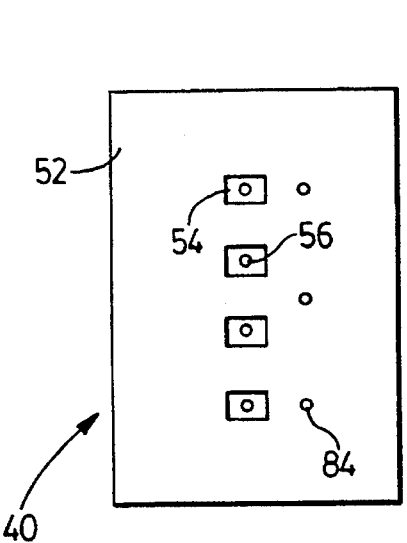
FIG. 4
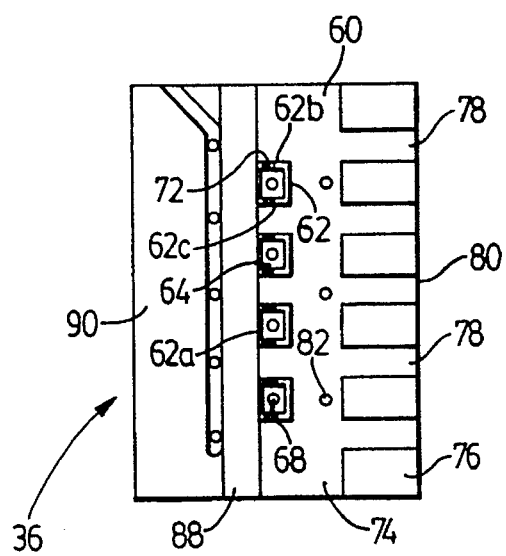
FIG. 5
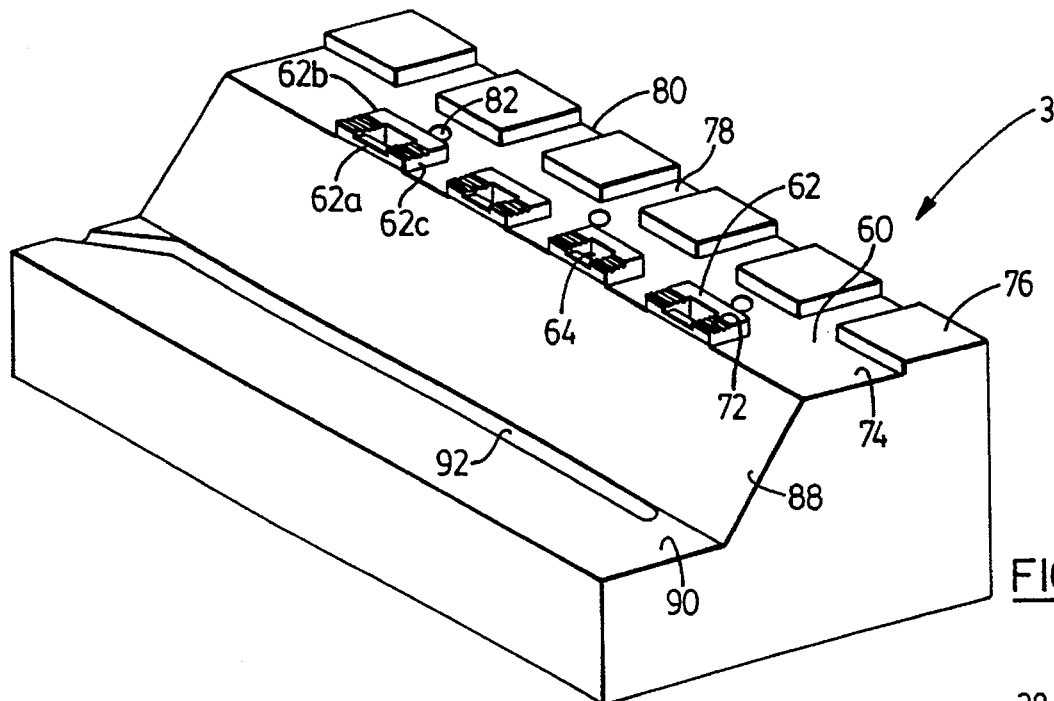
FIG. 6
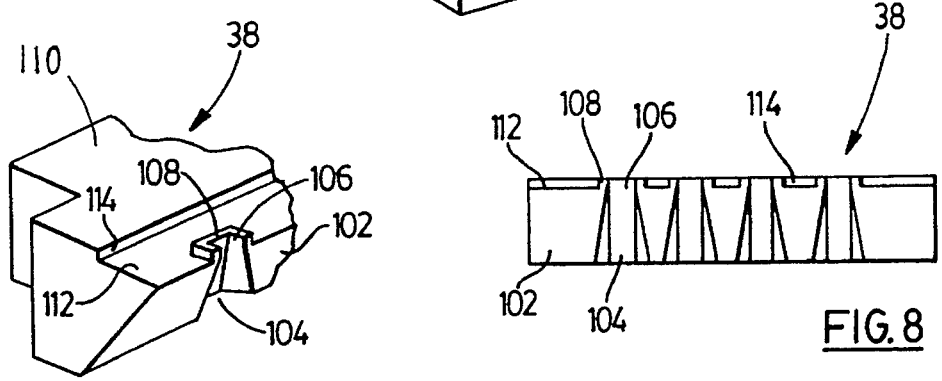
FIG. 7
FIG. 8

METHOD FOR MOLDING IC CHIPS

FIELD OF THE INVENTION

This invention relates to method and apparatus for encapsulating integrated circuit chips, other circuit components, and other parts requiring encapsulation. More particularly it relates to method and apparatus for encapsulating integrated circuit chips and other parts which are spaced uniformly apart and mounted on a carrier such as a carrier tape or lead frame.

BACKGROUND OF THE INVENTION

After integrated circuit chips are formed, leads must be bonded to them, and then the chips must be encapsulated in epoxy or other protective material. The lead bonding process is commonly performed by providing a thin strip carrier such as a metal lead frame or a plastic metal coated tape such as that sold under the trade mark KAPTON. The required leads are normally preformed on the lead frame or tape and project into openings in the lead frame or tape. The chips are placed in the openings and the leads are then bonded to the chips e.g. by thermal compression bonding (as is well known).

After the leads have been bonded to the chip, the chips are encapsulated, normally by injection molding of a thermosetting plastic or other suitable material around the chips. In the injection molding process a cavity must be closed around each chip and then molten plastic must be directed through runners to the cavities. In the past this process has commonly involved directing the runner over and in contact with the lead frame, causing the plastic when it hardens to stick to the lead frame. This is acceptable for a metal lead frame, since the lead frame is strong and the plastic can be broken away from it during the degating process. However this method is not acceptable for metal coated plastic tape, since the plastic sticks to the tape and cannot be removed without tearing the tape.

As a result, encapsulation of chips mounted in metal coated plastic tape has in the past been a slow batch process, with long cycle times and also commonly involving a considerable amount of wasted plastic.

Similar difficulties have been encountered in encapsulating other electrical components, e.g. resistors, capacitors and diodes. The process would, for example, be faster and less costly if they could be encapsulated in a continuous process. The same applies to other small parts requiring encapsulation.

OBJECT OF THE INVENTION

Accordingly, it is an object of the invention to provide method and apparatus for encapsulating parts in a carrier, such that plastic will not come in contact with the carrier and so that simple part ejection with automatic degating can be achieved. Usually the part will be an integrated circuit chip or other electrical component, but it can be any appropriate part requiring encapsulation.

In one aspect the invention provides a method of encapsulating a part which is mounted on a carrier, said carrier having a plurality of openings therein, each opening having a periphery, a part being located in each opening and being free of contact with said periphery, and support means extending between the periphery of each opening and the part in such opening for retaining and positioning said part in said opening, said method comprising:

(a) closing first and second mold portions about said part to form a cavity about said part, no portion of said carrier being included in said cavity, (b) then directing fluid plastic through runner means and into said cavity to fill said cavity around said part, said runner means extending through said first mold portion but not said second mold portion and into said cavity and being free of contact with said carrier, (c) then permitting the plastic in said cavity and runner means to harden, (d) then separating said mold portions, (e) while said first and second mold portions are being separated, ejecting said part from said first mold portion but retaining said part in said second mold portion, and thereby separating said part, after its encapsulation, from the hardened plastic in said runner means, (f) then ejecting said part from said second mold portion, (g) and ejecting the hardened plastic in said runner means.

In another aspect the invention provides molding apparatus for encapsulating a part which is mounted on a carrier, said carrier having a plurality of openings therein, each opening having a periphery, a part located in each opening and being free of contact with said periphery, and support means extending between said periphery of each opening and the part in such opening for retaining and positioning said part in said opening, said apparatus comprising:

(a) first and second mold portions defining a cavity for receiving a said part, no portion of said carrier being included in said cavity, (b) means for opening and closing said mold portions, (c) said mold portions including positioning means for retaining said carrier in a defined position between said mold portions when said mold portions are closed, for locating said part in said cavity, (d) said first mold portion including runner passage means for directing fluid plastic into said cavity, said runner passage means extending only through said first mold portion and not said second mold portion, (e) said runner passage means being free of contact with said carrier, (f) first ejector means for ejecting an encapsulated part from said first mold portion and for simultaneously retaining said encapsulated part in said second mold portion when said mold portions are opened after encapsulation, and thereby for breaking a said encapsulated part away from hardened plastic in said runner passage means, (g) second ejector means operable after said mold portions have been opened and said encapsulated part has been ejected from said first mold portion, for ejecting said encapsulated part from said second mold portion, (h) and third ejector means for ejecting hardened plastic from said runner passage means after said part has been ejected from said first mold portion.

Further objects and advantages of the invention will appear from the following description, taken together with the accompanying drawings.

BRIEF DESCRIPTION OF THE DRAWINGS

In the accompanying drawings:

FIG. 4 is a plan view of the lower surface of the top half of a mold according to the invention;

FIG. 5 is a plan view of the top surface of a lower cavity part of a mold according to the invention;

FIG. 6 is a perspective view of the lower cavity part of FIG. 5;

FIG. 7 is a perspective view of a portion of a slide which cooperates with the lower cavity part of FIG. 6.

FIG. 8 is a front view of the slide of FIG. 7;

DETAILED DESCRIPTION OF PREFERRED EMBODIMENTS

Figure 1:
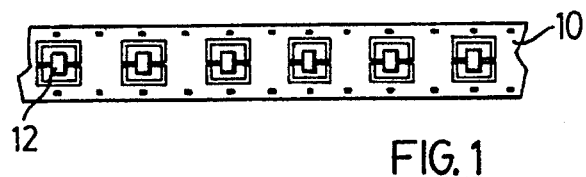
FIG. 1 is a top view of a conventional metal coated plastic tape carrier having a number of integrated circuit chips mounted in it and ready for encapsulation.
Figure 2:
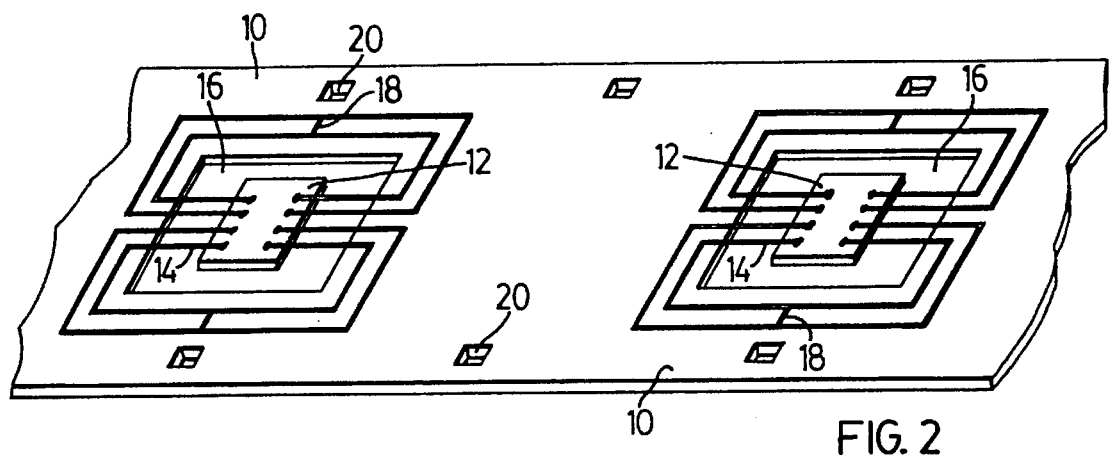
FIG. 2 is an enlarged view of a portion of the tape carrier of FIG. 1 and showing a chip and its leads.

The preferred embodiment of the invention will be described with reference to the encapsulation of an integrated circuit chip. Reference is first made to FIGS. 1 and 2, which show a conventional KAPTON (trademark) metal coated plastic tape carrier 10 carrying integrated circuit chips 12. The chips 12 are shown as having eight leads 14 (four extending from each side of each chip), but chips may commonly have more leads. The leads 14 extend into rectangular apertures 16 formed in the tape carrier, and the chips 12 are centered in such apertures, ready for encapsulation. The leads 14 are normally connected together as shown at 18 to prevent stray voltages from damaging the chips before the chips are removed from the tape. Index holes 20 at each side of the tape allow the tape to be accurately indexed for molding.

Figure 3:
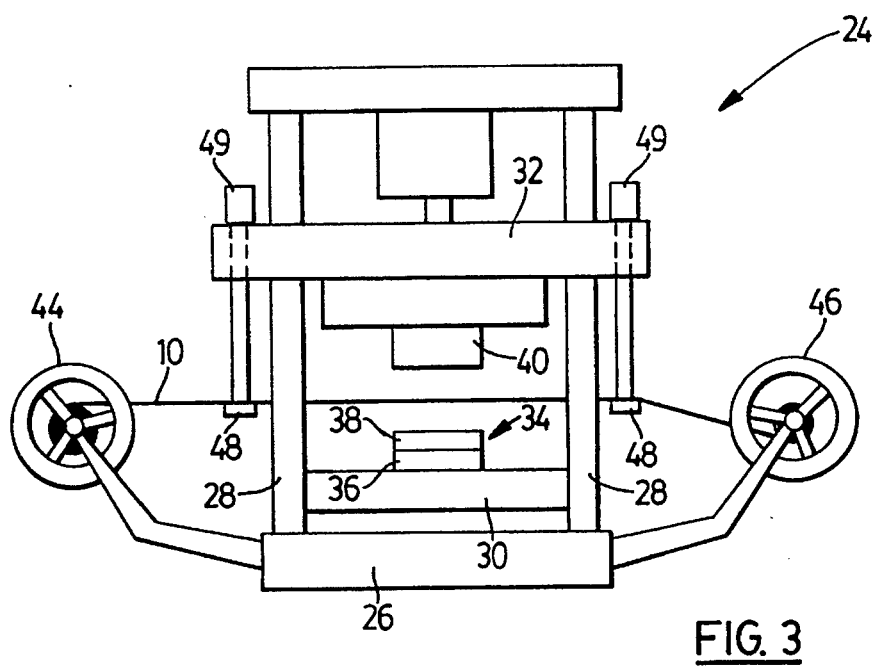
FIG. 3 is a view of a reel to reel molding apparatus according to the invention, shown in open position.

Reference is next made to FIG. 3 which shows the organization of a press 24 according to the invention. The press 24 includes a base 26, four vertical posts 28 (only two are shown), a fixed lower platen 30 and an upper platen 32 moveable vertically on posts 28. The lower platen 30 carried a lower mold half 34 containing a cavity part 36 and a slide 38 (to be described in more detail shortly). The upper platen 32 carries an upper mold half 40 (also to be described in detail shortly).

Two tape carrier reels 44, 46, are mounted one on each side of the base 26. A length of the tape carrier 10, containing integrated circuit chips 12 ready to be molded, is wound on wheel 44, which is the supply reel. The tape carrier 10 extends over vertically moveable horizontal support bars 48 (which are independently vertically moveable, by pistons 49) and between the lower and upper mold halves 34, 40, and then extends to the reel 46, which is the take-up reel.

As will be explained, during the molding process the support bars 48 lower the tape carrier 10 onto the lower mold half 34 and the upper mold half 40 closes over the tape. Each integrated circuit chip between the mold halves is thereby located in a cavity. Plastic is injected into the cavities to encapsulate the chips, after which the mold halves are separated; the tape carrier is disengaged from the mold halves in a specific manner to be explained; the plastic in the runner system is removed, and the tape carrier is indexed forwardly a suitable distance to encapsulate the next set of chips in the tape. During the forward indexing, tape carrying encapsulated chips is wound on the take-up reel 46. While one mold containing a desired number of cavities is shown in FIG. 3, a number of molds can be used in the same press as desired, to increase productivity. At the same time, two or more tape carriers, located side by side, can extend through the press, with two or more supply and take-up reels.

Figure 11:
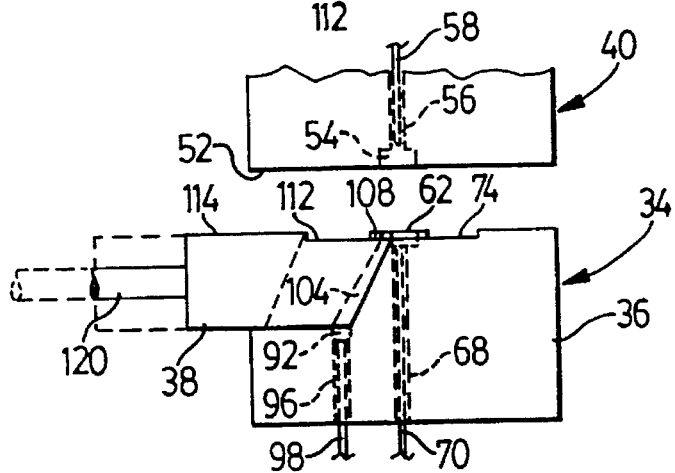
FIG. 11 is an end view of the lower cavity part and slide in closed position with the top mold half in open position.

Reference is next made to FIG. 4, which is a plan view of the bottom surface 52 of the upper mold half 40. As shown, the bottom surface 52 (which is the operative surface and is normally horizontal) is a smooth flat surface containing e.g. four upper cavity openings 54. The cavity openings 54 are simply small rectangular depressions inset into the bottom surface 52 to accommodate the top half of the encapsulated chip. Circular bores 56 extend through the upper mold half 40 to accommodate upper ejector pins 58 (as shown in FIG. 11).

Reference is next made to FIGS. 5 and 6, which show the cavity part 36 of lower mold half 34. The cavity part 36 includes a flat horizontal upper surface 60 having five sets of slightly raised lower cavity side walls 62 formed thereon. Each cavity side wall 62 defines a rectangular lower cavity opening 64. The side wall 62a at the front of each cavity opening 64 is slightly lower than the remaining walls, to permit entrance of fluid plastic, as will be described. A bore 68 (FIG. 11) extends through each lower cavity part 36 and into the bottom of each lower cavity opening 64 to accommodate a lower ejector pin 70 also shown in FIG. 11.

Two opposite side walls 62b, 62c of each cavity opening 64 each contain small grooves 72 in their upper surfaces, to accommodate the leads 14 and so that the mold halves form a dam around them, so that plastic will not be forced out of the closed cavity along the leads.

The upper horizontal surface 60 of the cavity part 36 also includes a shallow groove 74 therein to receive one side of the carrier tape 10. The groove 74 is defined by a raised metal portion 76 which itself contains grooves 78 which extend to the rear edge 80 of the lower cavity part 36, to allow air to escape as the mold is being closed. Bores 82 in the groove 74 accommodate alignment pins (not shown) which penetrate into aligned bores 84 (FIG. 4) in the upper mold half, to ensure that the tape is properly located and that the mold halves are suitably aligned when the mold is closed.

Figure 10:
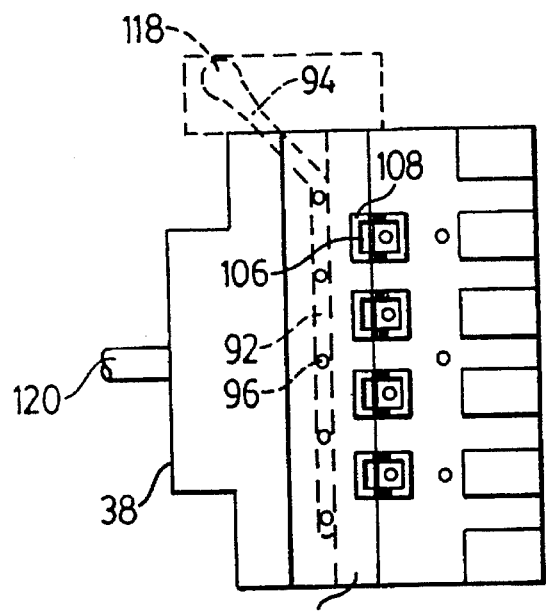
FIG. 10 is a plan view of the top surfaces of the lower cavity part and slide of FIGS. 5 and 7 in closed position.

The cavity part 36 further includes a sloping front wall 88. Wall 88 extends from the fronts of the lower cavity wall sets 64 downwardly and forwardly to a second and lower horizontal surface 90. The horizontal surface 90 extends to the front of the cavity part 36 and includes therein a runner groove 92. The runner groove 92 in horizontal surface 90 extends along the base of the sloping wall 88 past all of the lower cavity walls 62, and then extends forwardly to the edge of the cavity part 36 where it intersects another runner portion shown in dotted lines at 94 in FIG. 10. Several spaced vertical bores 96 (FIGS. 10, 11) extend through the lower mold half 34 into the bottom of the groove 92 to accommodate runner ejector pins 98.

Figure 9:
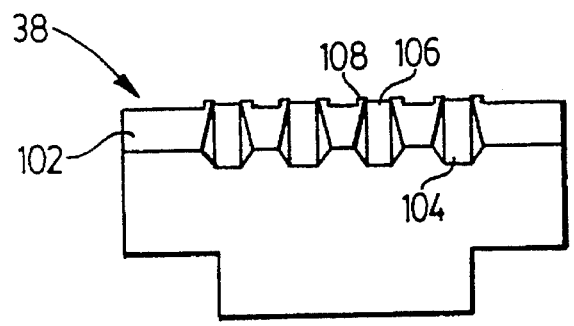
FIG. 9 is a plan view of the bottom surface of the slide of FIG. 7.

The cavity part 36 cooperates with the slide 38. The slide 38 is shown in detail in FIGS. 7, 8 and 9 and is also shown in closed position on the cavity part 36 in FIGS. 10 and 11. The slide 38 includes a sloping rear wall 102 which has the same slope and height as and matches the sloping front wall 88 of the cavity part 36. The slide 38 cooperates with front wall 88 to form part of the runner system which conveys plastic from the groove 92 to the mold cavities.

For this purpose the rear wall 102 of the slide contains a set of channels 104. Each channel 104 is generally triangular in cross-section, being widest at its bottom (adjacent groove 92) and tapering toward its top and terminating in an opening 106 surrounded by a raised wall 108. The tops of walls 108 are flush with the tops of walls 62 (except for lowered wall 62a) and press against the lower surface 52 of upper mold half 40 when the mold halves are closed.

The upper surface 110 of slide 38 is flat except for the raised walls 108, and except for a shallow groove 112 therein. Groove 112 is of the same height as walls 108 and is defined by a metal formation 114. The groove 112 accommodates the other side of carrier tape 10.

Figure 12:
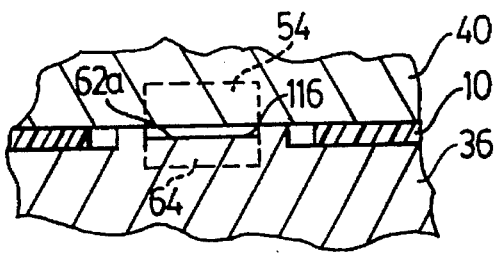
FIG. 12 is a sectional view showing a tape carrier located in the bottom and top mold halves with such mold halves in closed position.

When the slide 38 is closed, the bottom portions of the channels 104 are located directly over the runner groove 92 and receive plastic from the groove 92. The bottom surface 52 of upper mold half 40 is located over lowered side walls 62a, defining a small gate opening 116 (FIG. 12) in the side of the cavity. The plastic therefore flows upwardly to the tops of channels 104 in the slide, over the dams formed by lowered walls 62a, and through gates 116 into the cavities formed by the upper and lower mold halves 40, 34, where it encapsulates the chips. The plastic does not contact any part of the tape carrier 10.

Because the fluid plastic enters the side of each mold cavity, rather than entering from the top or bottom, it quickly fills the spaces above and below each chip 12 without voids. The plastic is supplied in conventional manner e.g. by heating a small container of plastic 118 (FIG. 10) which communicates with the runner groove outer portion 94, and then compressing the plastic 118 with a piston.

Figure 13:
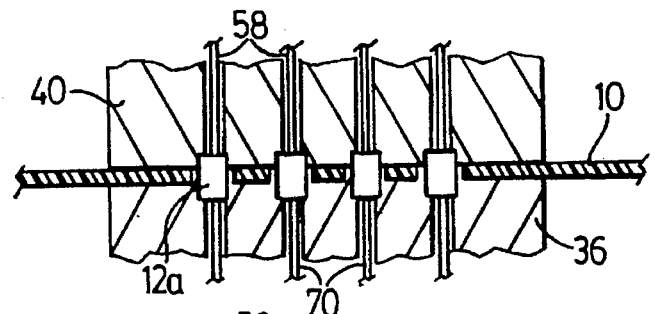
FIG. 13 is a sectional view showing a tape carrier carrying encapsulated chips which are located in the cavities formed by the top and bottom mold halves.
Figure 14:
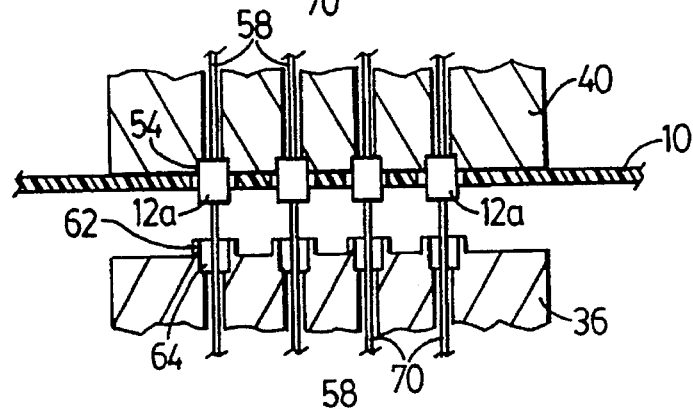
FIG. 14 is a view similar to that of FIG. 13 but showing the top mold half raised and the tape carrier raised with it.

After the plastic has cured, which is normally within a few seconds since little plastic is used, the mold can be opened. The mold opening procedure is described with reference to FIGS. 13, 14 and 15 and FIG. 10. Initially, as shown in FIG. 13, the mold halves 34, 40, including lower cavity part 36 and slide 38, are all closed about the carrier tape 10 and encapsulated chips 12a. Then, firstly the upper mold half 40 is raised (by raising the upper platen 32) as shown in FIG. 14. As the upper mold half 40 is raised, the ejector pins 70 in the lower cavity part half 36 at the same time follow the upper mold half 40 upwardly, retaining the encapsulated chips 12a securely in the upper mold cavity halves 54 and thereby breaking (degating) the encapsulated chips from the plastic in the runner system. Since the plastic in the runner system is connected to the encapsulated chips only by the plastic in the very small gate openings 116 formed by the space between lowered end walls 62a and mold surface 52, little force is applied to the encapsulated chips 12a during this chip ejection procedure. Thus, automatic degating (i.e. removal of the parts from the plastic of the runner system) is effected.

Figure 15:
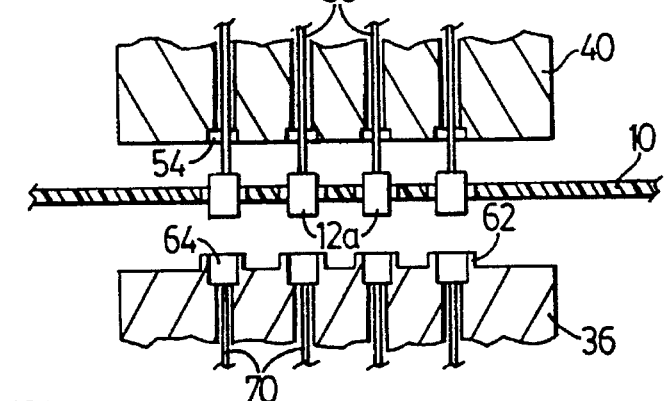
FIG. 15 is a view similar to FIG. 14 but showing the tape carrier and encapsulated chips separated from the top mold half.
Figure 16:
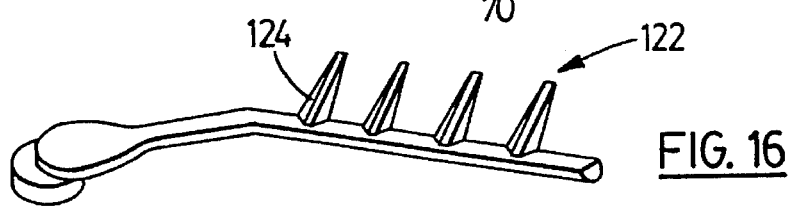
FIG. 16 is a perspective view of a plastic runner which has been removed from the molding process after completion of the molding process.

The lower ejector pins 70 follow the upper mold half 40 upwardly only for a short distance, e.g. 0.025 inches, and then stop. By this time the encapsulated chips 12a have been broken away from the plastic in the runner system as shown in FIG. 14. Then, as the upper mold half 40 continues to move upwardly, the encapsulated chips, if they do not stick to it, tend to fall from it and hence be removed from it. In any event, after the upper mold half 40 has moved upwardly by about ¼ inch, the upper ejector pins 58 in the upper mold half are moved downwardly, as shown in FIG. 15. This positively ejects the encapsulated chips from the upper mold half 40. At this time the carrier tape is supported by the moveable support bars 48, which have been raised to the height of the tape.

The upper ejector pins 58 are then retracted and the upper mold half 34 is raised further. The tape 10 is then indexed forwardly (with a portion being wound on take-up reel 46) to place the carrier tape in position between the mold halves to encapsulate the next set of chips.

In the meanwhile, slide 38 is retracted by a piston (not shown) connected to rod 120 (FIGS. 10, 11) which is connected to the front end of slide 38. The slide 38 is retracted to the dotted line position shown in FIG. 11, exposing the plastic in runner groove 92. The plastic which was in channels 104 now simply extends up the flat surface of sloping wall 88. Runner ejector pins 98 are then moved upwardly to eject the plastic in the runner system. The ejected plastic is shown at 122 in FIG. 15 (the plastic which was in channels 104 appears at 124) and may be disposed of or recycled. The slide 38 is then reclosed in preparation for another molding cycle.

In the next molding cycle, after the tape carrier 10 has been advanced to the desired position, and after slide 38 has been reclosed, the tape carrier 10 is lowered onto the lower mold half 34. The upper mold half 40 is lowered onto the tape carrier and lower mold half, and fresh plastic is injected through groove 92.

It will be seen that in the preferred embodiment described, the main runner groove 92 is on a separate level from the tape carrier and does not touch the tape carrier, and the channels 104 from the runner groove 92 to the cavities extend within the openings 16 in the tape carrier and also do not touch the tape carrier. Therefore the plastic never contacts the tape carrier 10. Not only does the sloping or vertical movement of the plastic toward the cavity through channels 104 ensure that there is no contact between the plastic and the tape carrier, but it also permits the plastic to be admitted into the side of the cavity, for more uniform encapsulation. In addition, auto degating is achieved since the part is ejected while pinning the hardened plastic in the runner system in place (by the slide 38), after which the hardened plastic is separately ejected. This method permits reel to reel molding and allows much faster cycle times than have previously been obtainable. For example, cycle times may typically be about 45 seconds.

While the chips have been shown as located on a tape carrier, they can also if desired be located on other kinds of carriers, e.g. lead frames.

Figure 17:
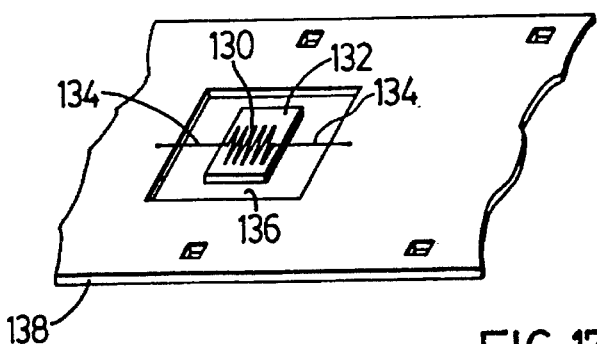
FIG. 17 is a perspective view of a resistor with attached leads, mounted and ready to be encapsulated.

While the parts being encapsulated have been described as integrated circuit chips, they can be other electrical components or other parts (usually small) needing encapsulation. For example, resistors or resistive networks are commonly printed on a ceramic substrate, leads are attached, and then the parts are encapsulated in plastic. An exemplary printed resistor is shown in FIG. 17, with resistive film 130 printed on a substrate 132 and connected to two leads 134. The leads 134 mount the resistor in aperture 136 in tape carrier 138. Exactly the same procedure and apparatus may be used to encapsulate the FIG. 17 resistor as are used for the integrated circuit chips previously described.

Similarly the part to be encapsulated can be a diode formed on a substrate, a capacitor (in which case the capacitor leads can be similarly mounted on a tape or lead frame before molding), or a combination of these or other electrical components. The part can also be any other small part to which fine leads or supports can be conveniently attached to locate the part in an aperture in a lead frame or tape.

It will be appreciated that various changes may be made within the spirit of the invention described and all such changes are within the scope of the appended claims.

I claim:

1. A method of encapsulating a part which is mounted on a carrier, said carrier having a plurality of openings therein, each opening having a periphery encircling said opening, a part being located in each opening and being free of contact with said periphery, and support means extending between the periphery of each opening and the part in such opening for retaining and positioning said part in said opening, said method utilizing a heat curable fluid encapsulation material and comprising:

(a) closing first and second mold portions about said part to form a cavity about said part, no portion of said carrier being included in said cavity, (b) then directing said fluid encapsulation material through a runner means and into said cavity to fill said cavity around said part, said runner means extending through said first mold portion but not said second mold portion and into said cavity and being free of contact with said carrier, (c) then permitting the encapsulation material in said cavity and runner means to cure, (d) then separating said mold portions, (e) while said first and second mold portions are being separated, ejecting said part from said first mold portion but retaining said part in said second mold portion, and thereby separating said part, after encapsulation of said part, from the cured encapsulation material in said runner means, (f) then ejecting said part from said second mold portion, (g) ejecting the cured encapsulation material in said runner means, said first mold portion comprising first and second mold parts, said first mold part being movable relative to said second mold part alternately to expose and cover encapsulation material in said runner means, and wherein in said step (g), said first mold part is moved to expose the cured encapsulation material in said runner means.

2. The method according to claim 1 wherein said part is an electrical component.

3. The method according to claim 2 wherein said component is an integrated circuit chip.

4. The method according to claim 2 wherein said component is a capacitor.

5. The method according to claim 2 wherein said component is a diode.

6. The method according to claim 2 wherein said component is a resistance.

7. The method according to claim 1 or 2 wherein said cavity has top and bottom surfaces and a side, said part having top and bottom surfaces parallel to said top and bottom surfaces of said cavity, and wherein said plastic enters said cavity at said side, thus to facilitate flow of encapsulation material over said top and bottom surfaces of said part.

8. A method according to claim 1 or 2 wherein said carrier is a flexible tape, said method including the steps of supplying said tape with said part thereon from a supply reel and winding said tape, with encapsulated parts thereon, on a take-up reel, each cycle of performing said steps (a) to (g) inclusive being a molding cycle, and moving a portion of said tape from said supply reel towards said take-up reel after each molding cycle.

9. A method according to claim 1 or 2 wherein said support means comprises leads connected to said part and wherein, when said first and second mold portions are closed, such mold portions seal about said leads to prevent flashing from forming about said leads.

10. A method according to claim 1 wherein said first mold part of said first mold portion is a slide member and is slidably moved over said second mold part alternately to cover and expose encapsulation material in said runner means.

11. A method according to claim 10 wherein said carrier extends in a plane, said slide member includes a first sloping surface sloping toward said plane at a predetermined angle to said plane, and said second mold part includes a second sloping surface sloping toward said plane at said predetermined angle, said first and second sloping surfaces defining between them a portion of said runner passage means, the step of moving said first mold part uncovering said portion to expose encapsulation material in said portion.

12. A method according to claim 11 wherein said runner passage means enters said cavity at an aperture in said cavity, said aperture having a periphery which is defined in part by said first mold portion and in part by said second mold portion, so that when said mold portions are separated and said first mold part is moved, cured encapsulation material in said aperture will be uncovered.

* * * * *